(12) United States Patent
Ivey et al.

(10) Patent No.: US 6,245,208 B1
(45) Date of Patent: Jun. 12, 2001

(54) CODEPOSITING OF GOLD-TIN ALLOYS

(75) Inventors: Douglas Gordon Ivey, Edmonton; Wenzhen Sun, Ottawa, both of (CA)

(73) Assignee: Governors of the University of Alberta, Edmonton (CA)

( * ) Notice: Subject to any disclaimer, the term of this patent is extended or adjusted under 35 U.S.C. 154(b) by 0 days.

(21) Appl. No.: 09/290,192

(22) Filed: Apr. 13, 1999

(51) Int. Cl.$^7$ .................................................. C25D 3/62
(52) U.S. Cl. .................................. 205/248; 205/247
(58) Field of Search ..................... 205/297, 298

(56) References Cited

U.S. PATENT DOCUMENTS 5,277,790   1/1994   Morrissey .
5,902,472 * 5/1999   Arai et al. .............................. 205/125

OTHER PUBLICATIONS

C. Kallmayer, D. Lin, J. Kloeser, H. Oppermann, E. Zakel and H. Reichl, 1995 IEEE/CPMT International Electronics Manufacturing Technology Symposium, (1995) 20, No month available.

C. Kallmayer, D. Lin, H. Oppermann, J. Kloeser, S. Werb, E. Zakel and H. Reichl, 10th European Microelectronics Conference, (1995) 440, No month available.

E. Zakel and H. Reichl, Chapter 15, in *Flip–Chip Technlogies*, ed., J. Lau, McGraw–Hill, (1995) 415, No month available.

T. Osaka, A. Kodera, T. Misato, T. Homma, Y. Okinada, and O. Yoshioka, *J. Electrochem. Soc.*, 144 (1997) 3462, No month available.

T. Inoue, S. Ando, H. Okudaira, J. Ushio, A. Tomizawa, H. Takehara, T. Shimazaki, H. Yamamoto and H. Yokono, Proceedings of IEEE 45th Electronic Components and Technology Conference, May 21–24, 1995.

M. Kato, Y. Yazawa and Y. Okinaka, International Technical Conference Proceedings, American Electroplaters and Surface Finishers Society, (1995) 813, No month available.

A.C. Tan, Chapters 8–10, "Tin and Solder Plating in the Semiconductor Industry", Chapman and Hall (1993), No month available.

D.R. Mason, A. Blair and P. Wilkinson, *Trans. Inst. Met. Finish.*, 52 (1974) 143, No month available.

E. Raub and K. Bihlmaier, *Galvanische Weissgolniederschlage, Mitt. Forschungsinst. Probierants. Edelmetalle Staatl. Hoheren Fachschule Schwab. Gmund*, 11 (1937) 59, No month available.

N. Kubota, T. Horikoshi and E. Sato, *J. Met. Fin. Soc. Japan*, 34 (1983) 37, No month available.

Y. Tanabe, N. Hasegawa and M. Odaka, *J. Met. Fin. Soc. Japan*, 34 (1983) 8, No month available.

A. Gemmler, W. Keller, H. Richter and K. Ruess, High–Performance Gold Plating for Microdevices, Plating and Surface Finishing, Aug. 1994, pp. 52–57.

* cited by examiner

*Primary Examiner*—Kathryn Gorgos
*Assistant Examiner*—Christopher M. Keehan
(74) *Attorney, Agent, or Firm*—C. A. Rowley

(57) ABSTRACT

A relatively stable, weakly acidic, non-cyanide electroplating solution for deposition of Au—Sn alloys over a range of compositions. The solution consists of Au and Sn chloride salts, as well as ammonium citrate as a buffering agent and sodium sulphite and L-ascorbic acid as stabilizers. Preliminary electroplating experiments with the developed solution indicate that uniform, homogeneous deposits can be achieved over a range of compositions, including the technologically important eutectic and near euctectic values.

8 Claims, 14 Drawing Sheets

2.0 mA/cm²

2.8 mA/cm²

4 μm 3.2 mA/cm²

1 ms 2 ms 3 ms 4 ms

2μm

CODEPOSITING OF GOLD-TIN ALLOYS

FIELD OF INVENTION

The present invention relates to an improved gold-tin (Au—Sn) alloy and plating bath composition for codepositing the Au—Sn alloy, a process of making the composition and to a new product produced thereby.

BACKGROUND OF THE INVENTION

Gold-tin (Au—Sn) eutectic solders are commonly used in the optoelectronic and microelectronic industries for chip bonding to dies. Au—Sn solder is classified as a "hard solder" with superior mechanical and thermal properties relative to "soft" solders, such as the Pb—Sn system. Au—Sn solder can be applied in a number of ways, i.e., as Au—Sn preforms, solder paste, by sequential evaporation and sequential electrodeposition. Compared with solder preforms and pastes, evaporated solder is cleaner and provides more precise thickness and positional control. Thin film deposition technology, however, involves expensive vacuum systems.

Electroplating of Au—Sn eutectic solder is an attractive alternative in that it is a low cost process, offering the thickness and positional control of thin film techniques. Au—Sn solder layers have been produced sequentially by depositing Au first on a seed layer, followed by Sn (see for example C. Kallmayer, D. Lin, J. Kloeser, H. Oppermann, E. Zakel and H. Reichl, 1995 *IEEE/CPMT International Electronics Manufacturing Technology Symposium*, (1995) 20; C. Kallmayer, D. Lin, H. Oppermann, J. Kloeser, S. Werb, E. Zakel and H. Reichl, 10*th European Microelectronics Conference*, (1995) 440; and E. Zakel and H. Reichl, Chapter 15, in *Flip-Chip Technologies*, ed., J. Lau, McGraw-Hill, (1995) 415).

Commercially available Au and Sn baths are utilized from which several microns of solder can be deposited sequentially. Co-electrodeposition of Au and Sn from a single solution offers the same economic advantage of sequential plating relative to vacuum deposition techniques, as well as the prospect of depositing the solder in a single step without oxidation of an outer Sn layer.

The technology for Au and Sn plating is quite well developed and will be briefly reviewed here.

Au Electrodeposition

Electrodeposition of soft Au on electronic devices and componenets is generally performed using a bath containing cyanoaurate (I) ions, because Au cyanide complexes have the highest stability coefficients. Free cyanide ions generated as a result of the Au deposition process attack the interface between the resist film and substrate, lifting the resist and depositing extraneous Au under the resist. Because of this incompatibility, work has focused on developing non-cyanide baths.

Au(I) sulphite complexes have better compatibility towards positive resists and the added benefit of improved throwing power and deposit thickness uniformity compared with cyanide baths. In addition, deposits from Au sulphite solutions are bright, hard and ductile. The Au(I) sulphite complex is subject to a disproportionation reaction, however, forming Au(III) and metallic Au, which causes the bath to decompose spontaneously on standing.

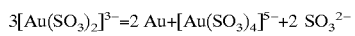

To prevent decomposition, a suitable stabilizing additive is needed.

The first commercial sulphite Au plating solutions were developed in the early to mid 1960s. The sulphite ion is itself in equilibrium with sulphur dioxide according to

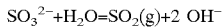

Because the above reaction forms hydroxyl ions, the equilibriun is pH-dependent. Most commercial solutions operate in the alkaline pH range, i.e., at pH values above 9.5. When Au is plated out of solution at alkaline pH, the excess sulphite remains and can be oxidized to sulphate at the anode.

There have been several attempts to reduce the operating pH to below neutral for applications involving alkaline-developable photoresists (see for example A. Gemmler, W. Keller, H. Richter and K. Ruess, *Plating and Surface Finishing*, 81 (1994) 52; R. J. Morrissey and R. I. Cranston, U.S. Pat. No. 5,277,790, Jan. 11, 1994; R. J. Morrissey, *Plating and Surface Finishing*, 80 (1993) 75; and T. Osaka, A. Kodera, T. Misato, T. Homma, Y. Okinada and O. Yoshioka, *J. Electrochem. Soc.*, 144 (1997) 3462).

The addition of organic polyamines, such as ethylenediamine, can be used to lower the pH to acidic values, allowing controlled evolution of sulphur dioxide to remove a portion of the excess sulphite (U.S. Pat. No. 5,277,790; R. J. Morrissey, *Plating and Surface Finishing* (above); and A. Meyer, S. Losi and F. Zuntini, *Proc. Fachtagung. Galvanotachnik*, Leipzig (1970), Swiss Patent 506,828 (1969)).

The possibility of electroplating soft Au from a non-cyanide bath containing both thiosulphate and sulphite as complexing agents has been explored (see for example T. Osaka, A. Kodera, T. Misato, T. Homma, Y. Okinada and O. Yoshioka, *J. Electrochem. Soc.*, 144 (1997) 3462; T. Inoue, S. Ando, H, Okudaira, J. Ushio, A. Tomizawa, H. Takehara, T. Shimazaki, H. Yamamoto and H. Yokono, Proceedings of IEEE 45th Electronic Components and Technology Conference, May 21–24, 1995; and M. Kato, Y. Yazawa and Y. Okinaka, *International Technical Conference Proceedings*, American Electroplaters and Surface Finishers Society, (1995) 813).

The bath reported by Osaka et al. operates at a pH of 6.0 and a temperature of 60° C. The bath is reported to be stable, although no specific stability data has been given. Three different Au complexes can exist in this system.

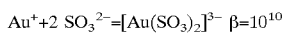

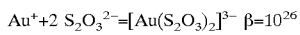

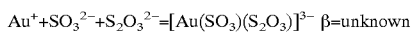

β is the stability coefficient for the complex. Thallium(I) ions have been added in the form of $Tl_2SO_4$ as a grain refiner to improve the surface morphology of the deposit.

Phosphates, carbonates, acetates and citrates are commonly used as buffering and conducting agents for Au plating baths. In alkaline Au sulphite baths, metals such as Cd, Ti, Mo, W, Pb, Zn, Fe, In, Ni, Co, Sn, Cu, Mn and V in various concentrations are used as brightening additives, while Sb, As, Se and Te semi-metals are also used.

Sn Electrodeposition

There are 2 types of Sn plating solutions: alkaline and acidic (see A.C. Tan, Chapters 8–10, "Tin and Solder Plating in the Semiconductor Industry", Chapman and Hall (1993)).

Alkaline solutions are based on sodium or potassium stannate. Hydrogen peroxide or sodium perborate is used to oxidize any stannite (bivalent Sn) to the stannate form. Alkaline baths are superior to acid baths in throwing power.

Acidic plating baths contain Sn in the bivalent form, using metal salts that are sulphates, fluoroborates and fluorosilicates. Electrodeposition of Sn from a stannous Sn solution has the obvious advantage of consuming less electricity (half the amount at 100% efficiency) compared with a stannate bath. The problems with acidic baths include poor throwing power and solution instability, with basic tin compounds precipitating on standing. Various additives, including gelatin, glue, cresol sulphonic acid and aromatic hydroxyl compounds, have been used to improve plating quality. When an acidic bath ages, the bath may change colour to darker yellow and may also become turbid. The actual chemistry of this change is relatively poorly understood, but is attributed to the formation of stannic compounds when stannous Sn salt is oxidized to stannic Sn in the presence of dissolved air and elevated temperature. The stannic compounds are colloidal and very difficult to remove. Oxidation of stannous Sn can be minimized by maintaining the solution temperature at 20–25° C., using an airtight plating setup and adding a suitable anti-oxidant such as a phenol compound. It has been reported that oxidation of bivalent Sn can be greatly suppressed or even eliminated by adding at least 1 organic ring compound, which has a radical group such as $NH_2$ or $NO_2$ attached in the ortho or para position.

Au—Sn Coelectodeposition

The available information concerning the electrodeposition of Au—Sn alloys is limited. One of the problems with Au—Sn alloy plating baths is preventing the oxidation of Sn(II) to Sn(IV) which is discussed in D. R. Mason, A. Blair and P. Wilkinson, *Trans. Inst. Met. Finish.*, 52 (1974) 143. Oxidation of Sn can be minimized by using soluble Sn anodes, however, Au is deposited on the anodes unless they are isolated by semy are isolated by semi-permeable diaphragms.

It has also been reported that Au—Sn alloys containing up to 30 at % Sn could be deposited from baths containing no free cyanide, and containing the Sn as its stannate complex formed with KOH (see E. Rau and K. Bihlimaier, *Galvanische Weissgolniederschlage, Mitt. Forschungsinst. Probierants. Edelmetalle Staatl. Hoheren Fachschule Schwab. Gmund*, 11 (1937) 59). Later claims concerning Au—Sn alloy plating, however, have been based on the use of alkaline and acid cyanide electrolytes, where Sn in many cases has been incorporated with the goal of obtaining brightening effects rather than producing deposits with significant amounts of Sn.

Several cyanide based systems have been reported (see T. Frey and W. Hempel, DE 4406434, (1995); W. Kuhn, W. Zilske and A.-G. Degussa, Ger. DE 4,406,434, Aug. 10, 1995: N. Kubota, T. Horikoshi and E. Sato, *J. Met. Fin. Soc. Japan*, 34 (1983) 37; and Y. Tanabe, N. Hasegawa and M. Odaka, *J. Met. Fin. Soc. Japan*, 34 (1983) 8). Frey and Hempel developed a bright Au—Sn plating bath with a pH of 3–14, comprised of potassium dicyanoaurate, soluble Sn(IV), potassium hydroxide, potassium salt of gluconic, glucaric and/or glucaronic acid, conductivity salt, piperazine and a small amount of As. The bath was used to plate small parts with an alloy containing 5–25 wt % Sn. Bright deposits were obtained for thicknesses greater than 0.1 $\mu$m and the solution exhibited long term stability without the use of soluble Sn anodes. A.-G. Degussa, Ger. DE 4,406,434 teaches using potassium dicyanoaurate and tin chloride and claims a deposit composition of 8 wt % Sn and thickness of 5 $\mu$m.

Au—Sn codeposition from a cyanide system using pyrophosphate as a buffering agent was studied by Kubota et al (N. Kubota, T. Horikoshi and E. Sato, *J. Met. Fin. Soc. Japan*, 34 (1983) 37; and N. Kubota, T. Horikoshi and E. Sato, *Plating and Surface Finishing*, 71 (1984) 46). The basic formula consisted of $K_4P_2O_7$, $KAu(CN)_2$ and $SnCl_2.2H_2O$. The mass transfer was investigated to clarify reaction mechanisms between monovalent Au or bivalent Sn and pyrophosphate ions, by measuring conductivity, kinematic viscosity and limiting current density of the bath components. Two pyrophosphate ions were complexed with 1 stannous ion, with excess pyrophosphate acting as a supporting constituent.

Tanabe et al, referred to above, obtained various Au—Sn alloy compositions by electrodeposition from cyanide baths containing $HAuCl_4.4H_2O$, $K_2SnO_3.3H_2O$, KCN and KOH. Although a linear relationship was not found between the Sn content in the bath and the Sn content in the alloy formed, a relationship was found between the 2 alloys which permitted formation of alloys of desired compositions. The composition of electrodeposited Au—Sn was shifted by about 10% to the Sn side in comparison with alloys at thermal equilibrium; thus exhibiting the $\xi$ phase in the 25–29 at % range. AuSn, $AuSn_2$ and $AuSn_4$ were also electrodeposited.

Gold chloride electrolytes were used in the early days of Au plating, but today are employed almost exclusively in the electrochemical refining of Au. An extensive investigation of the cathodic behaviour of Au in chloride solutions has shown that the quality of the cathode deposit is strongly influenced by the relative amounts of Au(I) and Au(III) in the solution. The reduction of Au(III) chloride to the metal can be expected to involve the formation of Au(I) as an intermediate species. Under plating conditions, Au will be deposited from both the Au(III) and Au(I) species. Since Au(I) has a more positive plating potential (1.154 V) than Au(III) (1.002 V), a limiting current density for Au(I) will be reached first and it can be expected that the deposits will be of relatively poor quality, i.e., they tend to be bulky and porous. Gold fines will be present in the solution as a result of the following disproportionation reaction:

$$3\ AuCl_2^- = 2\ Au + AuCl_4^- + 2\ Cl^-$$

Detailed studies of the anodic and cathodic reactions have shown that the use of low temperatures and periodic interruption of the current are major factors that can contribute to reduced Au(I) concentration.

Alkaline pH

Japanese patent JP56 136994 to Masayoshi Mashiko describes a process carried out under alkaline conditions and employing a bath composition containing gold, tin and copper and sodium sulfite or potassium sulfite was used as a stabilizer for the gold.

Acid pH

Japanese patent to S. Matsumoto and Y. Inomata, JP 61 15,992 [86 15.992], (Jan. 24, 1986) discloses a Au—Sn plating bath (pH=3–7) containing $KAuCl_4$, $SnCl_2$, triammonium citrate, L-ascorbic acid, $NiCl_2$ and peptone. A 7 $\mu$m Au—Sn alloy (20±2 wt % Sn) layer was plated out on a 50 mm diameter Si wafer at 208 C. and a current density of 0.6 A/dm$^2$ in 30 min using a Pt-coated non-consumable Ti anode. The stability of the bath seemed to be the weak link in this process as stability decreased dramatically when the Sn salt was added.

BRIEF DESCRIPTION OF THE PRESENT INVENTION

It is an object of the present invention to provide an new relatively stable gold (Au)—tin (Sn) electroplating solution that permits operation in the acid pH range.

It is a further object of the present invention to provide a new method of making a relatively stable Au—Sn electroplating solution.

Broadly, the present invention relates to an electroplating solution comprising ammonium citrate, a salt of gold (Au) soluble in said ammonium citrate, a salt of tin (Sn) soluble in said ammonium citrate, a gold stabilizer and a tin stabilizer.

Preferably said gold salt is a gold chloride and said tin salt is a tin chloride, more preferably the gold salt is a potassium gold chloride ($KAuCl_4$) and said tin salt is tin chloride ($SnCl_2$).

Preferably said gold salt is present in the amount of between 5 g/L and 15 g/L and said tin salt is present in the amount of between 5 g/L and 15 g/L.

Preferably the ratio of gold to tin is in the range of 0.5 to 3.0 (by weight).

Preferably said gold and tin are present in a ratio to form a near eutectic solder (25–40 atomic percent Sn) or more preferably a eutectic solder (27 to 35 atomic percent Sn).

Preferably the gold stabilizer is sodium sulfite and the Sn stabilizer is L-ascorbic acid.

The invention also relates to a method of making a gold-tin plating solution comprising dissolving a suitable tin salt in ammonium citrate to form a tin solution and dissolving a suitable gold salt in ammonium citrate to form a gold solution adding the tin solution to the gold solution drop by drop to form a combined solution while vigorously agitating the combined solution.

Preferably the gold salt is $KAuCl_4$ and the tin salt is $SnCl_2$.

Preferably a stabilizer is added to the gold solution before the tin and gold solutions are combined and preferably the gold stabilizer is sodium sulfite.

Preferably the tin salt solution is stabilized by the addition of L-ascorbic acid.

Preferably said gold and tin are present in a ratio to form a near eutectic solder (25–40 atomic percent Sn) or more preferably a eutectic solder (27 to 35 atomic percent Sn) An.

The invention also relates to a gold-tin electroplated structure having compositional variations of gold and tin across the entire structure of less than 5%.

Preferably the electroplated structure is composed of plate solder layers ranging in thickness from submicron (100–200 nm) to several microns.

BRIEF DESCRIPTION OF THE SEVERAL VIEWS OF THE DRAWING(S)

Further features, objects and advantages will be evident from the following detailed description of the preferred embodiments of the present invention taken in conjunction with the accompanying drawings in which.

DETAILED DESCRIPTION OF THE INVENTION

Figure 1:
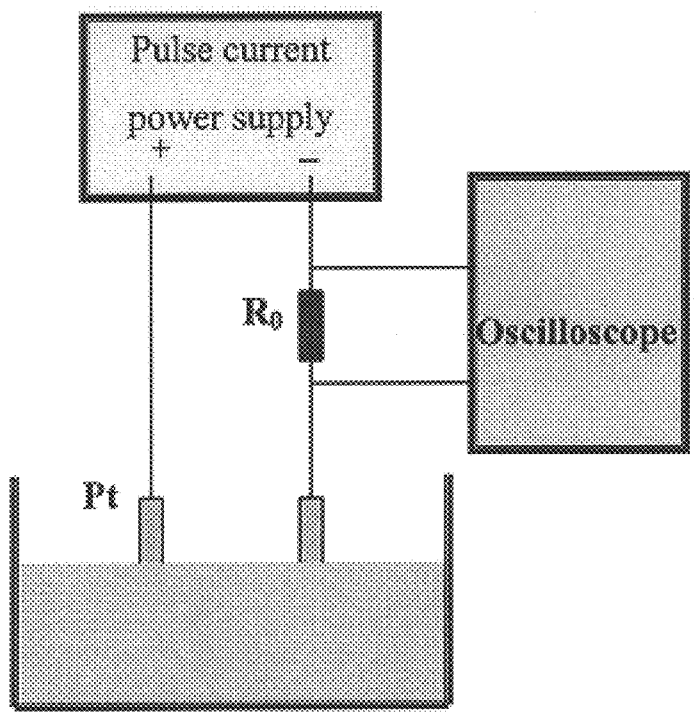
FIG. 1 is a schematic illustration of an electroplating arrangement.

The electroplating solution of the present invention is composed of ammonium citrate ($H_2NO_2CCH_2C(OH)$ $(CO_2NH_2)CH_2CO_2NH_2$), preferably triammonium citrate which functions as a buffering agent and in which a gold salt and a tin salt as well as stabilizing compounds for the gold and tin salts are dissolved. The gold and tin salts are preferably chlorides, most preferably potassium gold chloride $KAuCl_4$ and $SnCl_2$ respectively.

It is believed that other gold or tin salts may be suitable for use in the present invention, for example tin sulfate and $HAuCl_4$ are possibilities.

It is essential that suitable stabilizers be used, one for the gold salt and another for the tin salt. Applicant has found that suitable stabilizers for the gold salts are $Na_2SO_3$ and $Na_2S_2O_3$, although $Na_2SO_3$ is more effective at reducing Au precipitation during the addition of Sn salt. Ethylene diamine has also been tried as a Au stabilizer and it does improve the bath stability, but plating results have yet to be confirmed. When the preferred gold salt namely $KAuCl_4$ is used the preferred stabilizer is sodium sulfide ($Na_2SO_3$).

The suitable stabilizer for the tin salt is ascorbic acid. When the preferred tin salt namely $SnCl_2$ is used the preferred stabilizer is ascorbic acid, more specifically L-ascorbic acid ($HOCH_2CH(OH)(C(H)OC(O)C(OH)C(OH)$).

The various compounds will be present in the electroplating solution the following ranges: as set forth in Table A

TABLE A

|  | Broad range grams/Liter (g/L) of electroplating solution | Preferred range grams/Liter (g/L) of electroplating solution |
|---|---|---|
| ammonium citrate | 100 to 800 | 100 to 200 |
| gold salt | 5 to 20 | 5 to 10 |
| tin salt | 5 to 20 | 5 to 10 |
| gold stabilizer | 20 to 120 | 40 to 80 |
| tin stabilizer | 15 to 60 | 15 to 30 |

For some applications is preferred that the Au and Sn contents of the electroplating solution be set so that the resulting deposited material (under the depositing conditions to be applied) has Au and Sn contents at or close to their eutectic composition. Eutectic or near eutectic compositions are attractive for microelectronic/optoelectronic applications because of their relatively low melting temperatures.

The eutectic composition is 70 at % Au and 30 at % Sn. This composition provides the lowest melting temperature for subsequent bonding applications. Near eutectic compositions, particularly hypereutectic (greater the 30% Sn) are also desirable, because the solder is often used to bond Au coated wafers and chips which when combined with the solder lowers the overall Sn content in the solder. Also, Sn-rich solders do not increase the melting point as much as Au-rich solders (Au-rich relative to the eutectic composition). Generally the composition of the deposit will range from 25 to 40 at % Sn and more preferably from 27 to 35 at % Sn and most preferably for some application at the eutectic at 30 at %.

One can control the deposit composition by controlling the Au salt to Sn salt ratio and to a significant degree by controlling the plating conditions, i.e., current density, DC vs PC plating (ON time, OFF time, average current density, peak current density, etc. as will be discussed in more detail below).

In the description below of electroplating, a 1:1 ratio of Au salt to Sn salt was used. A composition plateau at 37–39 at % Sn is shown.

Nickel chloride ($NiCl_2$) may if desired be added as a leveler in the amounts of between 0 and 2 g/L.

The present invention evolved from the chloride system taught in the Matsumoto Japanese patent JP 61 15,992. Preliminary experiments were carried out on the solution described in the patent, but the solution deteriorated immediately when Sn salt was added to the ammonium citrate buffered Au solution.

The starting solution of the preferred compounds as above indicated was based on the Matsumoto patent JP 61 15,992 and are listed below:

200 g/L ammonium citrate ($H_4NO_2CCH_2C(OH)(CO_2NH_4)CH_2CO_2NH_4$)

20 g/L $KAuCl_4$ 13 g/L $SnCl_2.2H_2O$ 30 g/L L-ascorbic acid ($HOCH_2CH(OH)(C(H)OC(O)C(OH)C(OH))$)

1 g/L $NiCl_2$ 5 g/L peptone

Solution Preparation

The solution was prepared according to the various techniques summarized in Table I.

TABLE I

Solution Preparation

| Solution # | Solution | Observations |
|---|---|---|
| A | 13 g/L $SnCl_2.2H_2O$ dissolved in 30 g/L L-ascorbic acid solution. | • Clear solution with pH = 1.7<br>• Precipitation after 1 week. |
| B | 13 g/L $SnCl_2.2H_2O$ dissolved in 200 g/L ammonium citrate solution. | • Clear solution with pH = 6.5<br>• Solution still clear after 1 week but turned to dark yellow. |
| C | 10 g/L $KauCl_4$ dissolved in water. | • Solution turned black and turbid on standing.<br>• Precipitated fine black powder. |
| D | 10 g/L $KAuCl_4$ dissolved in water in darkness. | • Solution turned black and turbid on standing.<br>• Precipitated fine black powder. |
| E | 10 g/L $KAuCl_4$ dissolved in a 200 g/L ammonium citrate solution. | • Clear solution and stable in light. |
| F | Solution E added to B. | • Solution turned black and turbid on standing.<br>• Precipitated fine black powder. |
| G | 10 g/L $KAuCl_4$ dissolved in a 800 g/L ammonium citrate solution and then Solution B added. | • Same phenomena as Solution F. |
| H | 1. 10 g/L $KAuCl_4$ dissolved in a 800 g/L ammonium citrate solution.<br>2. 13 g/L $SnCl_2.2H_2O$ dissolved in 400 g/L ammonium citrate solution.<br>3. Solution (2) added to Solution (1) drop-by-drop with vigorous agitation. | • Clear solution with dark green colour.<br>• Precipitation after a few hours. |

Initial solution preparation results are shown in Table I. If Sn chloride is mixed with water, without any additives, the bivalent Sn chloride salt undergoes hydrolysis according to:

$$Sn^{2+}+2\ H_2O=Sn(OH)_2+2H^+$$

with a solubility product for $Sn(OH)_2$ of $3\times10^{-27}$.

Solution A in Table I contained 30 g/L of L-ascorbic acid, while Solution B contained 200 g/L of ammonium citrate. Both solutions were acidic, which helps to minimize hydrolysis preventing hydroxide precipitation. After 1 week Solution A became turbid, while Solution B changed to dark yellow from colourless, but remained clear. The difference may imply that ammonium citrate is a complexing agent for $Sn^{2+}$ ions; however, no information was found in the literature concerning the complexing ability of ammonium citrate with bivalent Sn ions. Although the actual chemistry for the change in the solutions is not well understood, the change is attributed to the oxidation of stannous ions (II) by dissolved air to stannic ions (IV) and the formation of stannic compounds. Higher temperatures than room temperature result in increased oxidation rates. It can therefore be concluded that without any anti-oxidant additives, Solutions A and B are only stable for about a week. The behaviour of bivalent Sn ions in water is very complex. Possible forms of Sn ions in a chloride solution include $[SnCl]^+$, $[SnCl_2]$, $[SnCl_3]^-$ and $[SnOH]^+$ with stability constants of 14, 15, 50 and $10^{10}$, respectively.

$KAuCl_4$ is soluble in aqueous solutions and is light sensitive. It is used for toning silver photographic prints. Preparation of Solutions C and D (Table I) shows that $KAuCl_4$ undergoes hydrolysis both in light and in darkness. The solutions precipitate a fine black powder, which gradually changes to a gold color on standing. The powder was determined by EDX analysis to be metallic Au. In aqueous solution, $AuCl_4^-$ ions are hydrolyzed to some extent forming $(AuCl_3)H_2O$. This in turn acts as a weak acid forming species such as $AuCl_{4-n}(OH)_n$ (where n varies from 0 to 4 and increases with increasing alkalinity) in alkaline solutions.

$$AuCl_4^-+H_2O=(AuCl_3)H_2O+Cl^-=AuCl_3(OH)^-+H^++Cl^-$$

The pH value of Solution E containing 200 g/L of ammonium citrate falls in the range of a weak acid. The hydrolysis of $KAuCl_4$ is prevented by the presence of concentrated ammonium citrate. $(NH_4)^+$ hydrolyzes in water, $$(NH_4)^+=NH_3+H^+$$

and produces a significant amount of $NH_3$ that dissolves in the solution. $NH_3$ can form complex $Au(NH_3)^{3+}$ cations with simple Au(III) ions (if any are present) in the solution. The stability of Au(III) ions in the solution is further improved. The stability constant for $AuCl_4^-$ is $10^{26}$; however, no stability constant data for $Au(NH_3)^{3+}$ is available in the literature.

Preparation of Solution F (Table I) was the first attempt to make a Au—Sn solution. It turned black and turbid immediately after the Au solution (E) was added to the Sn solution (B). The exact chemistry responsible for the instantaneous precipitation of fine black powder is not clear because of the lack of relevant information. Still, it is reasonable to surmise that a chemical interaction between Au ions and Sn ions causes the problem. The chemical processes for Au precipitation when Sn salt and Au salt are mixed can be $AuCl_4^-$ ion reduction to $AuCl_2^-$ ions, followed by $AuCl_2^-$ ion dissociation.

$$3\ AuCl_2^-=AuCl_4^-+2\ Au+2\ Cl^-$$

Since ammonium citrate is able to complex Au ions, solutions with more concentrated ammonium citrate should be more stable. Preparation of Solutions G and H is the result of such an attempt. No improvement was found for Solution G, while Solution H was the first solution that remained clear after preparation. Solution H was prepared by adding the Au solution drop-by-drop instead of by pouring the entire Au solution in the Sn solution. This implies that a high concentration of ammonium citrate is needed to eliminate the chemical reaction between Au(III) ions and Sn(II) ions. The way that ammonium citrate works may be twofold, i.e., as either a Au complexing agent or a Sn complexing agent. Since a very high concentration of ammonium citrate is needed to stabilize Au or Sn ions, it can be surmised that it is not a strong complexing agent for either Au(III) or Sn(II) ions. Solution H has 2 major problems in terms of being used as a practical plating solution. One problem is its short lifetime; the solution deteriorated by precipitating only a few hours after preparation. The other problem is the high viscosity of the solution, due to the high concentration of ammonium citrate. High viscosity results in a slow mass transport rate and therefore a lower limiting current density. Although the improvement in Solution H relative to the other solutions was minor, the key to developing a stable Au—Sn solution seems to lie in finding a more efficient Au complexing agent to decrease the oxidizing ability of Au ions when mixed with the reducing agent, bivalent Sn.

It will be apparent that to obtain a stable solution requires the use of a specific mixing sequence, as without it the results are not acceptable. As shown in Table 1 the procedure defined in H was the only one that succeeded and it required that the gold salt be dissolved in the ammounium citrate and then a solution of the tin salt in ammonium citrate be added drop (volume less than about 5 mL) after drop to the gold salt solution while under continuous vigorous agitation.

While procedure H showed the most promise it still did not provide the stability required for most commercial operations.

To compensate for this deficiency in stability three candidate stabilizers were reviewed namely, $Na_2SO_3$ (20–100 g/L), $Na_2S_2O_3$ (20–100 g/L) amd $Na_2H_2EDTA.2H_2O$ (5–40 g/L). The stabilizers were added separately to a solution of 300 g/L of ammonium citrate and 10 g/L of $KAuCl_4$. The solution preparation procedure was to add chemicals in the following sequence: ammonium citrate, Au salt, stabilizer and then the Sn chloride salt (5 g/L). Each solution was stirred thoroughly after each step to ensure complete dissolution.

$Na_2SO_3$ was more effective than $Na_2S_2O_3$ at reducing Au precipitation during the addition of Sn salt. The $Na_2SO_3$ containing solution was clear and stable for several days, while Au precipitation occurred within a few minutes for the $Na_2S_2O_3$ containing solution. $Na_2H_2EDTA$ is a complexing agent for many base metal impurities in plating baths. However, it fails to prevent interaction between Au and Sn ions; Au precipitates on the wall of the beaker within a few minutes of mixing the Au and Sn solutions.

In the method of preparing Au—Sn sulphite solutions of the present invention, Au is added in the form of solid $KAuCl_4$ salt that is dissolved in a concentrated ammonium citrate solution. When $Na_2SO_3$ is added to the solution, no precipitation occurs. It is presumed that the Au(III) ions have been reduced to Au(I) ions. The stability of the Au—Sn solution was substantially improved; no Au precipitation occurred when Sn salt was added. Based on these results, $Na_2SO_3$ was selected for stabilizing Au ions for subsequent work.

Based on the screening tests, sodium sulphite was selected as a Au stabilizer for additional tests. L-ascorbic acid was chosen as the Sn stabilizer to prevent Sn hydrolysis.

Experiments were carried out according to Table II to test solution lifetime for different concentrations of additives.

TABLE II

| | Solutions Utilized for Bath Stability Tests | | | | | | | | | |
|---|---|---|---|---|---|---|---|---|---|---|
| | S1 | S2 | S3 | S4 | S5 | S6 | S7 | S8 | S9 | S10 |
| Ammonium citrate (g/L) | 200 | 200 | 200 | 200 | 100 | 200 | 200 | 200 | 200 | 200 |
| KAuCl$_4$ (g/L) | 5 | 5 | 5 | 5 | 7 | 7 | 7 | 10 | 14 | |
| Na$_2$SO$_3$ (g/L) | | | 60 | 60 | 60 | 60 | 30 | 60 | 60 | |
| L-ascorbic acid (g/L) | | 15 | | 15 | 15 | 15 | 15 | 15 | | 30 |
| SnCl$_2$.2H$_2$O (g/L) | 5 | | 5 | 5 | 7 | 7 | 7 | 10 | | 14 |
| Solution stability (days) | 0 | 0 | 4 | 15 | 11 | 9 | 3 | 7 | 8 | 7 |

Solutions S1 and S2, which contained no sulphite, deteriorated immediately when Sn salt was added. With 60 g/L of Na$_2$SO$_3$, Solution S3 remained clear and stable for 4 days; after which it began to gradually precipitate fine Au particles. Solution S4 was the same as S3, except for the addition of 15 g/L of L-ascorbic acid. The solution stability was improved to 15 days. Its stabilizing effect is quite surprising since L-ascorbic acid was originally added to prevent Sn hydrolysis. L-ascorbic acid only changed the pH from 6.5 to 6.0, since a high concentration of ammonium citrate, a buffering agent, was also present in the solution.

Comparison of Solutions S5 and S6 seems to indicate that that the concentration of ammonium citrate has very little influence on bath stability, which may be because most of the Au ions are present in the form of a Au sulphite complex. A lower citrate concentration is favoured for practical plating, since the viscosity is lower.

Comparison of Solutions S4, S6 and S8, which contained gradually increased amounts of Au and Sn salts, shows that the higher the total salt content, the shorter the bath lifetime. Because the chemical reaction rate is proportional to the reactant concentrations, the higher the total concentration of reactants (Au and Sn ions), the faster the Au precipitates from solution.

The effect of sulphite on bath stability is clearly evident by comparing Solutions S6 and S7. S7 contained less sulphite and its lifetime was shortened from 9 days to 3 days. Since the stability constant for Au sulphite is fairly low, free sulphite is required.

Another possible alternative to improve bath stability is to prepare and store the Au and Sn solutions separately and mix them when plating is to be performed. Solution S9 is a Au solution and S10 is a Sn solution. If S9 and S10 are mixed at a 1:1 volume ratio, the overall make-up would be the same as S7. The Au solution has a lifetime of 7–8 days, after which Au precipitation begins. The Sn solution turns light yellow from colourless after 7 days, but remains clear for more than 30 days. The reason that Au still precipitates from solutions containing sulphite is that the stability constant for the sulphite complex is not that large and, with time, any free sulphite is oxidized by air at the liquid/air interface. It would be expected that for solutions used for plating, the lifetime would be even shorter because of sulphite consumption by anodic and chemical oxidation and cathodic reduction. The change in colour of the Sn solution is due to oxidation of bivalent Sn to tetravalent Sn.

It is apparent that solutions S4 and S5 containing 70% ammonium citrate; 2% KAuCl$_4$; 21% Na$_2$SO$_3$; 5% L-ascorbic acid; and 2% SnCl$_2$.2H$_2$O and containing 53% Ammonium citrate; 3.5% KAuCl$_4$; 32% Na$_2$SO$_3$; 8% L-ascorbic acid; and 3.5% SnCl$_2$.2H$_2$O respectively were the most effective.

Electroplating

A schematic of an electroplating setup used to test the effectiveness of the plating solution of this invention is shown in FIG. 1. A pulsed current power supply, with ON and OFF time settings in the 0–9.9 ms range, was utilized. A 50Ω standard resistance R$_o$ was connected in series with the plating bath to monitor the peak current density in the circuit through an oscilloscope.

The cathodes were either InP or Si wafers, coated with Ti (25 nm)/Au (250 nm) blanket metallizations. Wafers were sectioned into smaller pieces, each having an exposed area ∪1 cm×1 cm defined by stop-off lacquer. Platinum foil was used as the anode. The cathode-anode spacing was maintained at a fixed value throughout the plating process.

Plating experiments were carried out at a fixed temperature (20° C.) under both direct current (DC) and pulsed current (PC) conditions. For PC plating, ON and OFF times were varied and their effects correlated with deposit composition and microstructure. One set of experiments was done at constant average current density (2.4 mA/cm$^2$), cycle period (10 ms) and plating time (1 hr), while varying the ON time from 0.2–5 ms. A second set of experiments was done while maintaining a constant peak current density (10 mA/cm$^2$), OFF time (8 ms) and plating time (80 min), and varying the ON time from 0.5–4 ms. Finally, plating experiments were done at OFF times ranging from 3–9.9 ms. The peak current density was maintained at 10 mA/cm$^2$, with an ON time and plating time of 2 ms and 80 min respectively.

The electorplating solution of the invention that was used for these electroplating tests was solution S4 (Table II) with a small amount (1 to 2 g/L) of leveller (1 g/L NiCl$_2$) added All electroplated samples were examined in a scanning electron microscope (SEM), equipped with an energy dispersive x-ray (EDX) spectroscopy system. An accelerating voltage of 20 kV was used for both imaging and composition analysis; pure Au and pure Sn standards were used for quantitative analysis. Both plan view and cross section samples were examined. Cross sections were either prepared by cleaving, for imaging and thickness measurements, or by polishing, for quantitative composition analysis. Deposit surface roughness was measured by atomic force microscopy.

Reproducibility tests were carried out to assess the repeatability of the plating bath. A single metallized InP wafer piece (1.5 cm² exposed area) was plated continuously from a 50 ml plating solution. An average current density of 1.6 mA/cm² was used, with an ON time of 2 ms and an OFF time of 8 ms, for a total of 40 hrs. Deposit composition was determined from polished cross sections at 2.25 $\mu$m intervals from the deposit-wafer interface.

DC vs PC Plating

Figure 2:
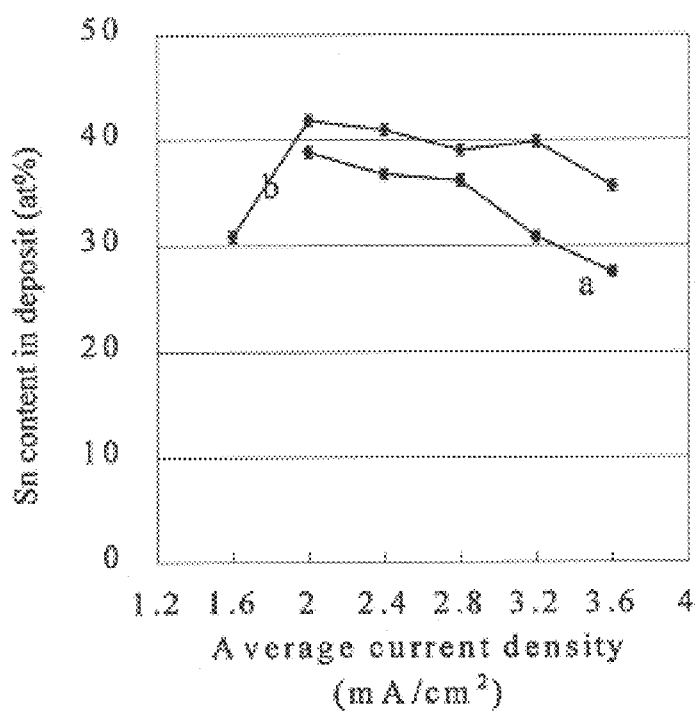
FIG. 2 is a plot of the Sn concentrations in the deposit when operating at different average current densities under direct current (DC) and pulsed current (PC) conditions.

Deposit composition results for direct current (DC) and pulsing current (PC) (ON time of 2 ms and OFF time of 8 ms) plated samples are shown in FIG. 2. The composition vs current tendencies are similar for DC and PC plating. The Sn content initially increases with increasing average current density, reaches a plateau and then decreases with increasing current density. Increasing the current density tends to favor plating of the less noble metal (Sn in this case). If the current density is too high, however, hydrogen evolution becomes significant, decreasing the efficiency of alloy plating. Hydrogen evolution may also cause a local increase in pH, increasing the susceptibility of Sn ion completing. Tin ions will be further stabilized as a result of complex formation, suppressing Sn plating and reducing tin concentration in the deposit.

From FIG. 2, it is clear that DC deposits obtained at the same current densities are consistently lower in Sn content than PC deposits. This result is similar to that found in other Au alloy pulse plating systems, e.g., Au—Co and Au—Ni systems, and may be due to a difference in polarization behavior for PC and DC modes. The cathodic potential in PC mode may be more negative relative to DC mode, which would favor Sn plating.

Figure 3:
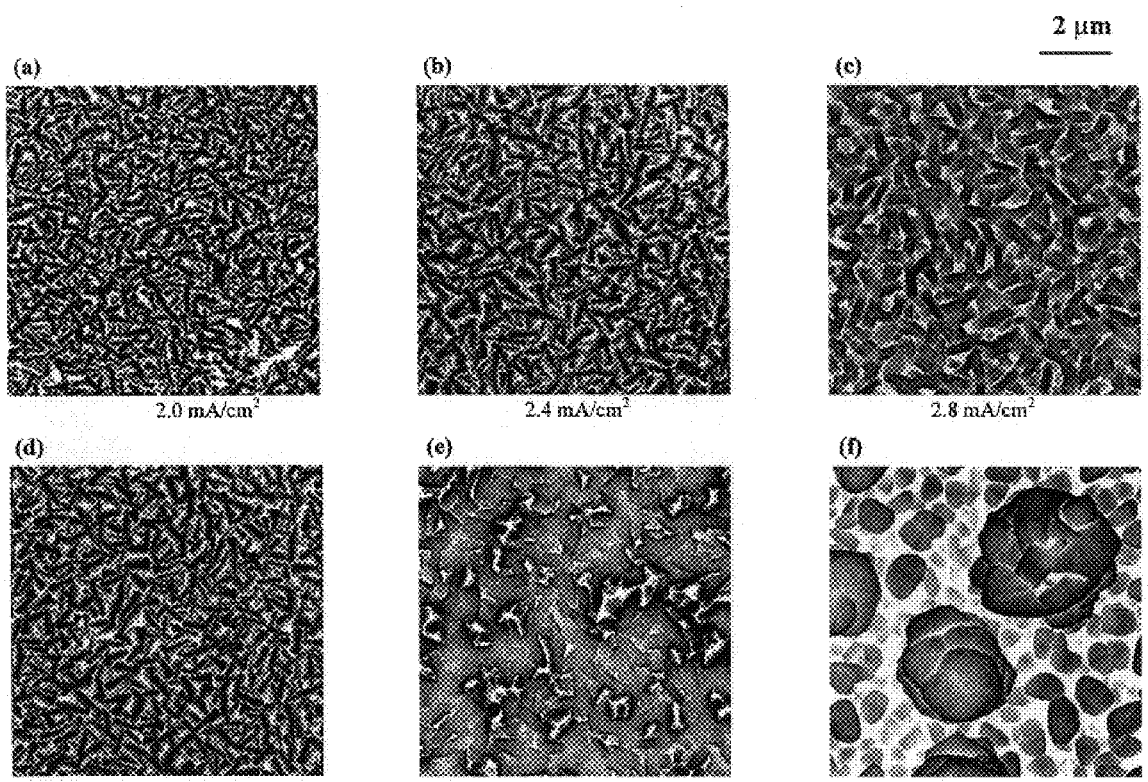
FIG. 3 is a copy of SEM top views of a plurality of PC and DC plated deposits.

Representative microstructures for the deposition conditions presented in FIG. 2 are shown in FIG. 3. DC and PC deposits are similar for current densities in the 1.6–2.0 mA/cm² range, i.e., at low average current densities PC plating has no obvious influence on deposit microstructure. Both DC and PC deposits show a tendency towards coarser microstructures at higher current densities, with the effect more pronounced for DC deposits. At a given average current density, the peak current density is considerably higher for PC plating, i.e., about 5 times that for DC plating (based on a duty cycle of 20%). The higher peak current density results in higher overpotentials and a finer deposit structure, because the rate of electron transfer in PC deposits to form adatoms is much faster than the diffusion rate of the adatoms across the surface to positions in the lattice, which favours nucleation. If the current density is too high, the limiting value is exceeded, i.e., metal ions are consumed faster than they can arrive at the cathode and the plating is under diffusion control, resulting in dendritic growth and a rough deposit surface.

Figure 4:
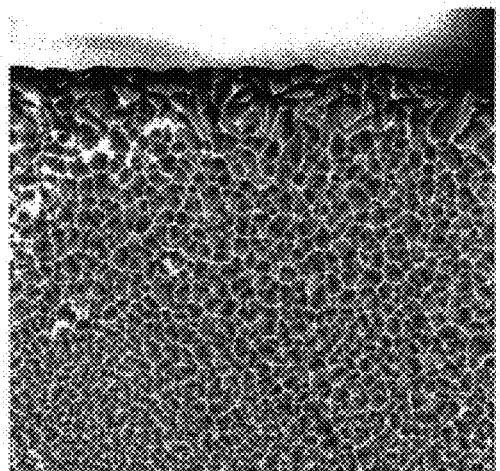
FIG. 4 is a copy of an SEM enlargement showing edge effects on the plated product.
Figure 4:
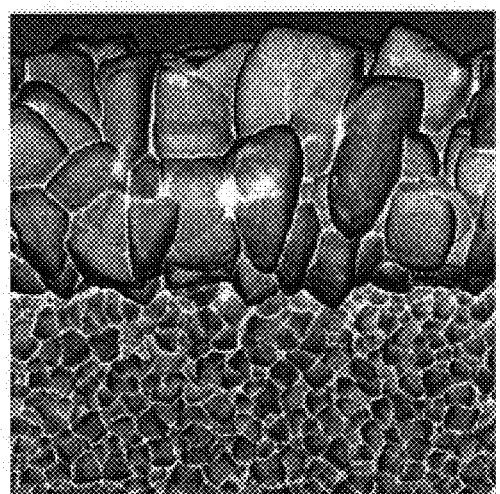
Figure 4:
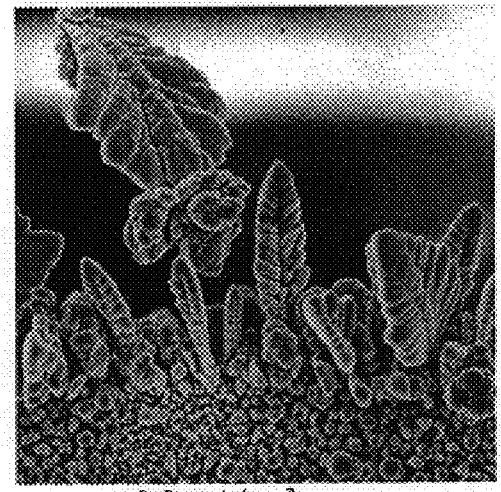

Sample edge effects in PC plating at average current densities of 2.0, 2.8 and 3.2 mA/cm² are shown in FIG. 4. Edge effects are clearly more pronounced at higher current densities. The actual current density at the edge is higher than the current density setting. As the average current density is increased, the actual current density approaches the limiting current density and the deposits are more likely to exhibit microstructures characteristic of limiting current conditions, i.e., coarse grains and even dendritic growth.

Effect of ON Time

Figure 5:
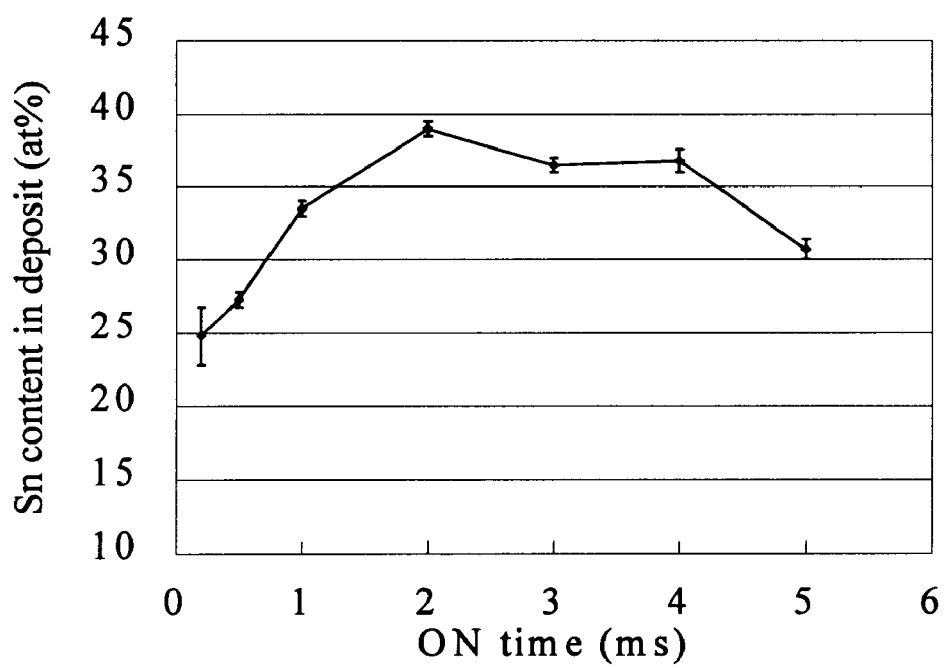
FIG. 5 is a plot showing the effect of ON time in PC plating on deposit composition, for a fixed average current density and cycle period.
Figure 6:
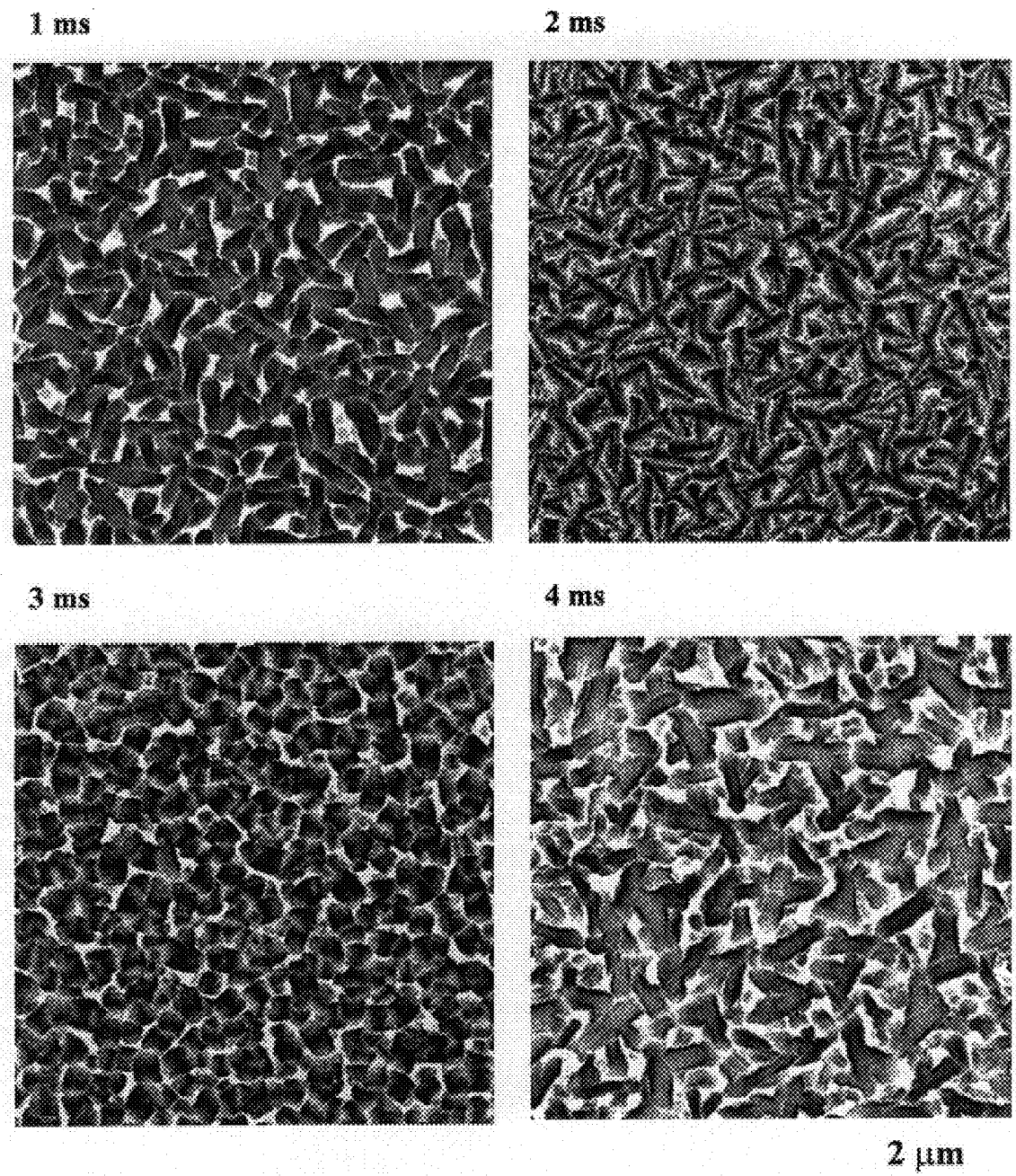
FIG. 6 is a copy of SEM top views of a plurality of PC deposits at various ON times—corresponds to the ON times in FIG. 5.

Deposit composition results obtained at different ON times, for a fixed average current density (2.4 mA/cm²) and cycle period (10 ms), are plotted in FIG. 5. Corresponding microstructures are shown in FIG. 6. The deposit composition plot initially increases with increasing ON time, forms a plateau in the 1–4 ms range and then decreases at values greater than 4 ms. The wide plateau has obvious advantages for practical plating operations. An increase in ON time corresponds to a decrease in the peak current density (since the average current density is fixed) and a decrease in the OFF time. If the ON time is too short, e.g., 0.2 to 0.5 ms, charging or capacitance effects are evident. The faradaic current for alloy plating is substantially lower than the peak current setting, which may explain the lower Sn content. At long ON times, e.g., 5 ms, the peak current density is quite low, which favours Au plating and therefore results in a lower Sn content. For example, at an ON of 5 ms, the peak current density is 4.8 mA/cm² which is Ú20% of the peak current density for an ON time of 1 ms.

For pure metal pulse plating, the ON time should be shorter than the transition time, otherwise hydrogen evolution or organic decomposition may occur. Hydrogen evolution decreases the current efficiency while organic decomposition causing carbon plating destroys the deposit by increasing the deposit resistance. For alloy pulse plating, the mechanism is somewhat more complicated than that for pure metal pulse plating, it is possible that each component has a transition time.

It is clear from the SEM micrographs in FIG. 6 that deposits obtained at 2 ms of ON time have the densest structures, finest grain size and smoothest deposits. This is confirmed by AFM surface roughness measurements. Deposit surface mean roughness values for 1, 2, 3 and 4 ms ON times are 73.8, 58.4, 64.1 and 62.9 nm, respectively.

Figure 7:
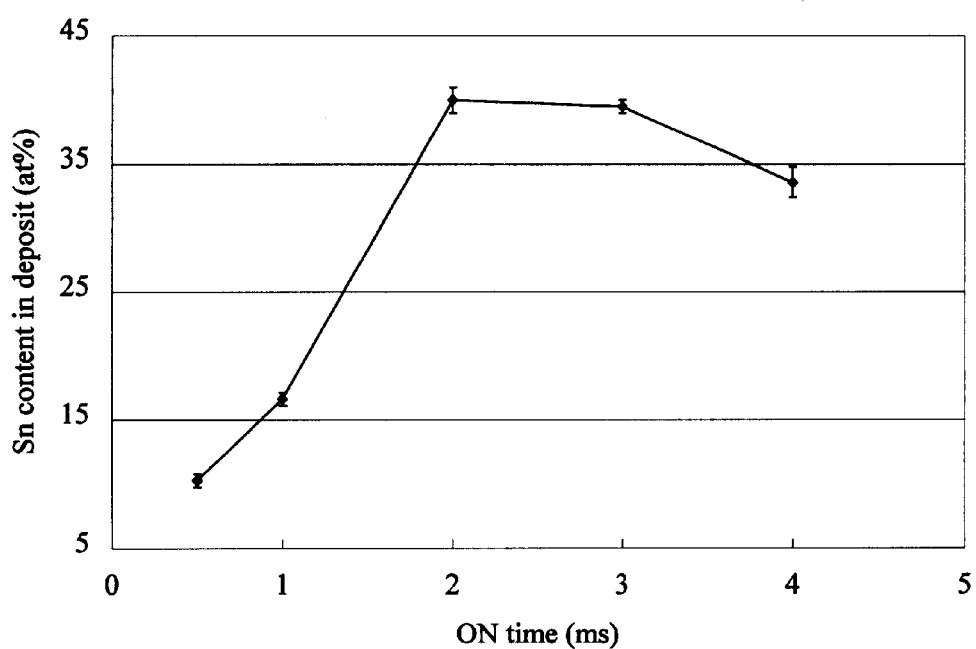
FIG. 7 is a plot showing the effect of ON times on deposit composition at a constant peak current density.

Deposit composition results obtained at different ON times, for a constant peak current density (10 mA/cm²) and OFF time (8 ms), are plotted in FIG. 7. The Sn content increases with increasing ON time for short ON times, reaches a plateau and then decreases with further increases in ON time. The rising portion of the curve may be related to the transition time for Au plating. For ON times longer than 0.5 ms, Au plating becomes diffusion controlled and Sn plating or hydrogen evolution begins. As such, the Au transition time is =0.5 ms. When the ON time is increased to Ú2 ms, both Au and Sn plating are likely diffusion controlled, giving rise to the plateau in the composition plot. Further increases in ON time lead to additional hydrogen evolution, which may result in an increase in the local pH value and suppress Sn plating.

Figure 8:
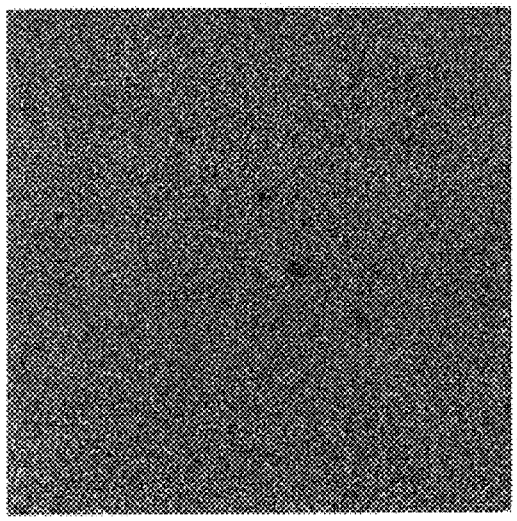
FIG. 8 is a copy of SEM top views of a plurality of PC at various ON times at constant peak current density—corresponds to the ON times in FIG. 7.
Figure 8:
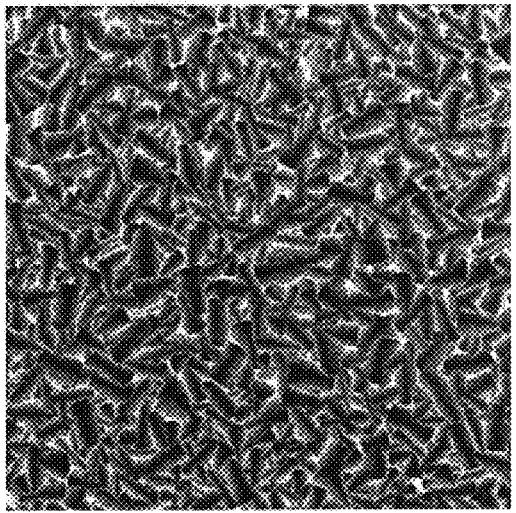
Figure 8:
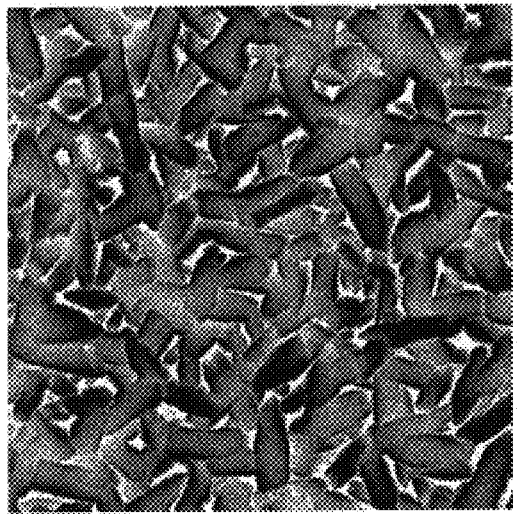
Figure 8:
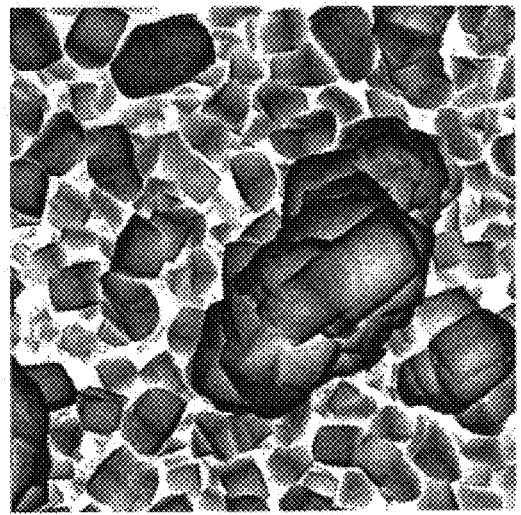

SEM micrographs of deposits obtained at different ON times are shown in FIG. 8. The 1 ms ON time sample has a much finer microstructure than the other deposits. This is due in part to its high Au content or low Sn content (16.7 at %) relative to the others, which have Sn levels greater than 33 at %. For the higher Sn content deposits, roughness increases with increasing ON time. At longer ON times, the average current density increases leading to thicker and coarser deposits. At 4 ms of ON time, the microstructure approaches that obtained from DC plating.

Figure 9:
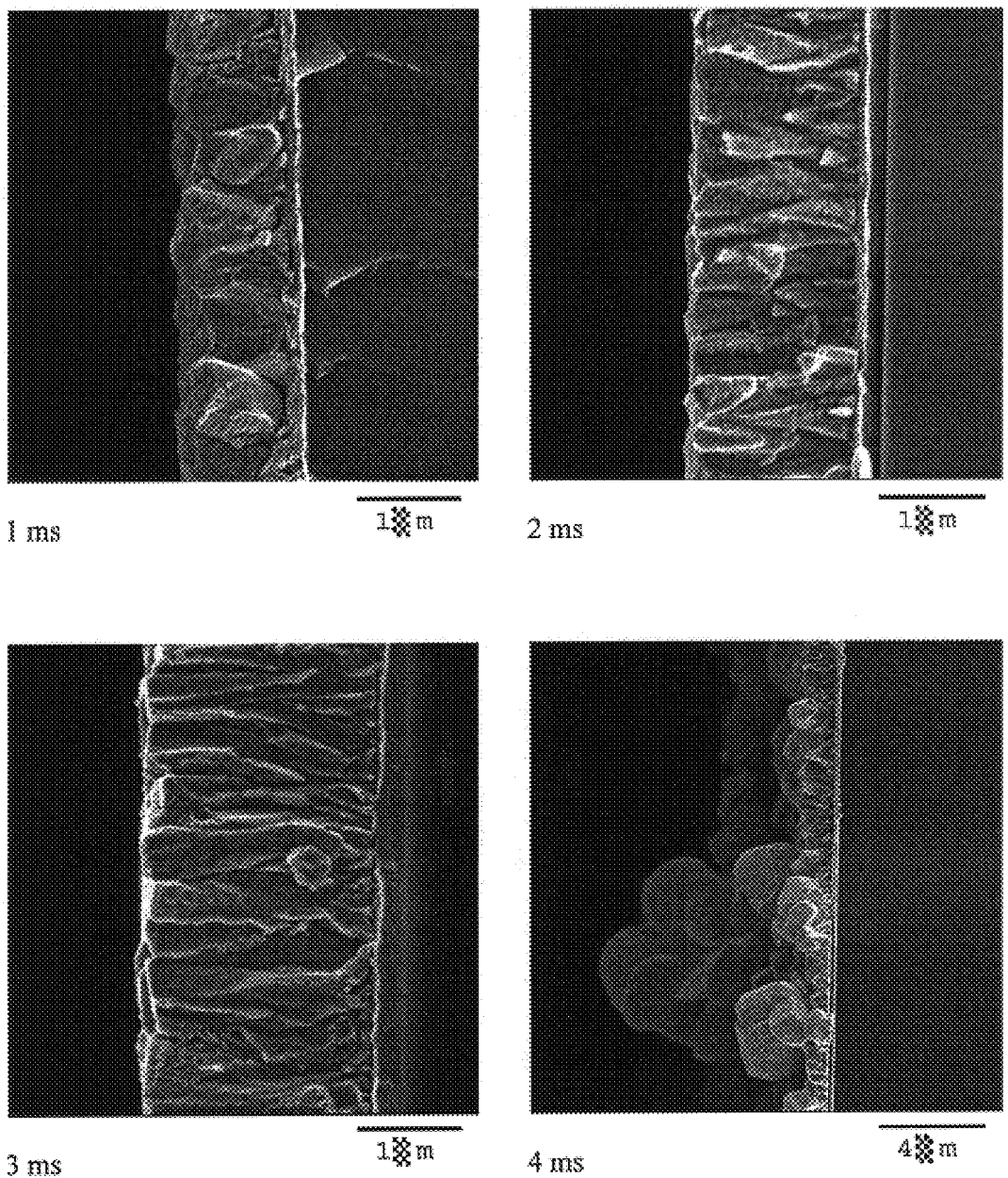
FIG. 9 is a series of cleaved cross section images of deposits taken at different ON times and constant peak current density—corresponds to the ON times in FIG. 7.

Cleaved cross sections of the deposits in FIG. 8 are shown in FIG. 9. The 1 ms ON time sample exhibits ductile fracture, which is due to its high Au content. Deposits obtained at 2 and 3 ms of ON time are dense and uniform and adhere well to the substrate. The microstructures are very similar to typical solidified cast structures, with the initial deposit fine grained and subsequent grains growing in a columnar manner. The fractured surfaces of these two deposits are more characteristic of brittle fracture, due to the increased amount of AuSn; both deposits are hypereutectic in composition, i.e., 39 at % Sn compared to the eutectic value of Ú30 at % Sn. The 4 ms ON time sample is very rough—its thickness varies from 1.4 to 8.9 $\mu$m—which is due to the high average current density (3.3 mA/cm$^2$), which is likely close to the limiting current density.

Practically speaking, ON times of 1–3 ms produce suitable microstructures and reasonable plating rates (0.7–1.7 µm/hr). Higher plating rates could be achieved by increasing the Au and Sn contents in the plating bath, which has the effect of increasing the limiting current density.

Effect of OFF Time

Figure 10:
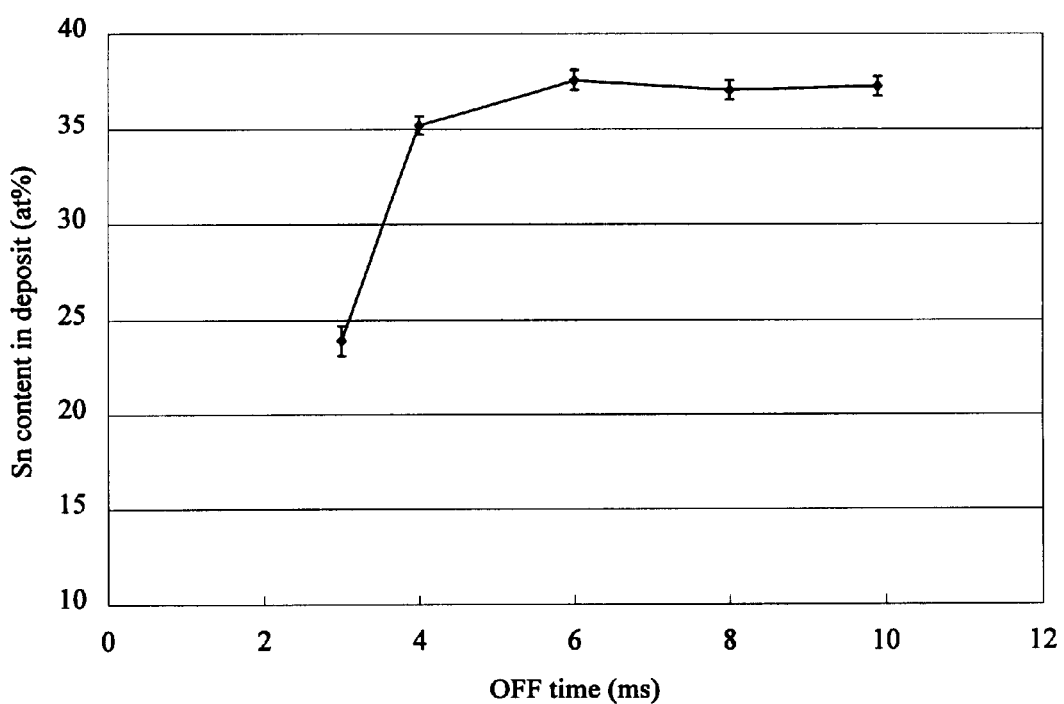
FIG. 10 is a plot of deposit composition at different OFF times and a constant peak current density.

The effect of OFF time on deposit concentration is shown in FIG. 10. In all cases, the peak current density was 10 mA/cm$^2$, the ON time was 2 ms and the plating time was 80 min. The Sn content initially increases for OFF times in the 3–4 ms range; further increases in OFF time lead to a constant Sn content. During the ON portion of the plating cycle, the cathode region becomes depleted of Sn ions. During the OFF time, the Sn ion concentration is recovered to some extent, before the next pulse, by the diffusion of Sn ions from the bulk solution to the depletion region. The extent of recovery depends on the length of OFF time. If the OFF time is long enough (∽4 ms here), the Sn ion concentration at the cathode reaches the bulk value before the next pulse. Any further increase in OFF time has no influence on deposit concentration.

Figure 11:
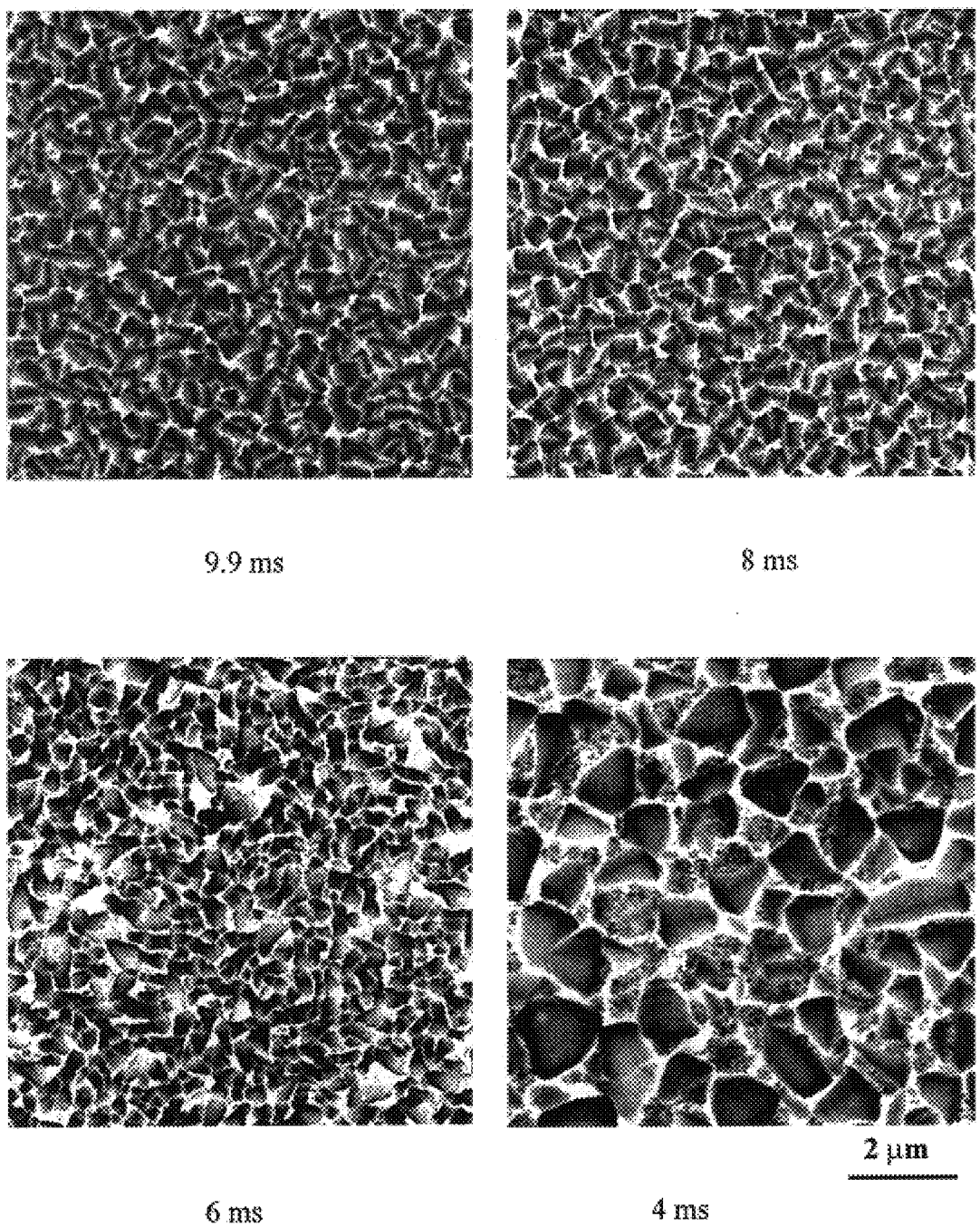
FIG. 11 is a copy of SEM top view of deposits obtained with different OFF times—corresponds to the ON times in FIG. 10.

SEM images corresponding to the deposits plotted in FIG. 10 are shown in FIG. 11. The 3 ms OFF time sample is not shown, but was quite porous and black in colour, which indicates a high carbon content in the deposit. The OFF time was too short to allow the Au and Sn concentrations at the cathode to return to the bulk values, resulting in a diffusion controlled plating condition. For deposits with OFF times =4 ms, the microstructure becomes finer with increasing OFF time, while the composition remains almost constant. The longest OFF times (8 and 9.9 ms) give similar microstructures, which indicates that the recovery time is sufficient.

OFF time has been reported to effect deposit microstructure in different ways. An increase in OFF time resulted in grain refinement for Cd deposition, but in grain growth for Cu and Au [19]. It is argued that for Cu and Au, grain growth, which is thermodynamically driven, occurs during the OFF cycle. For Cd, grain growth is believed to be retarded by adsorption of inhibiting species during the OFF cycle.

Figure 12:
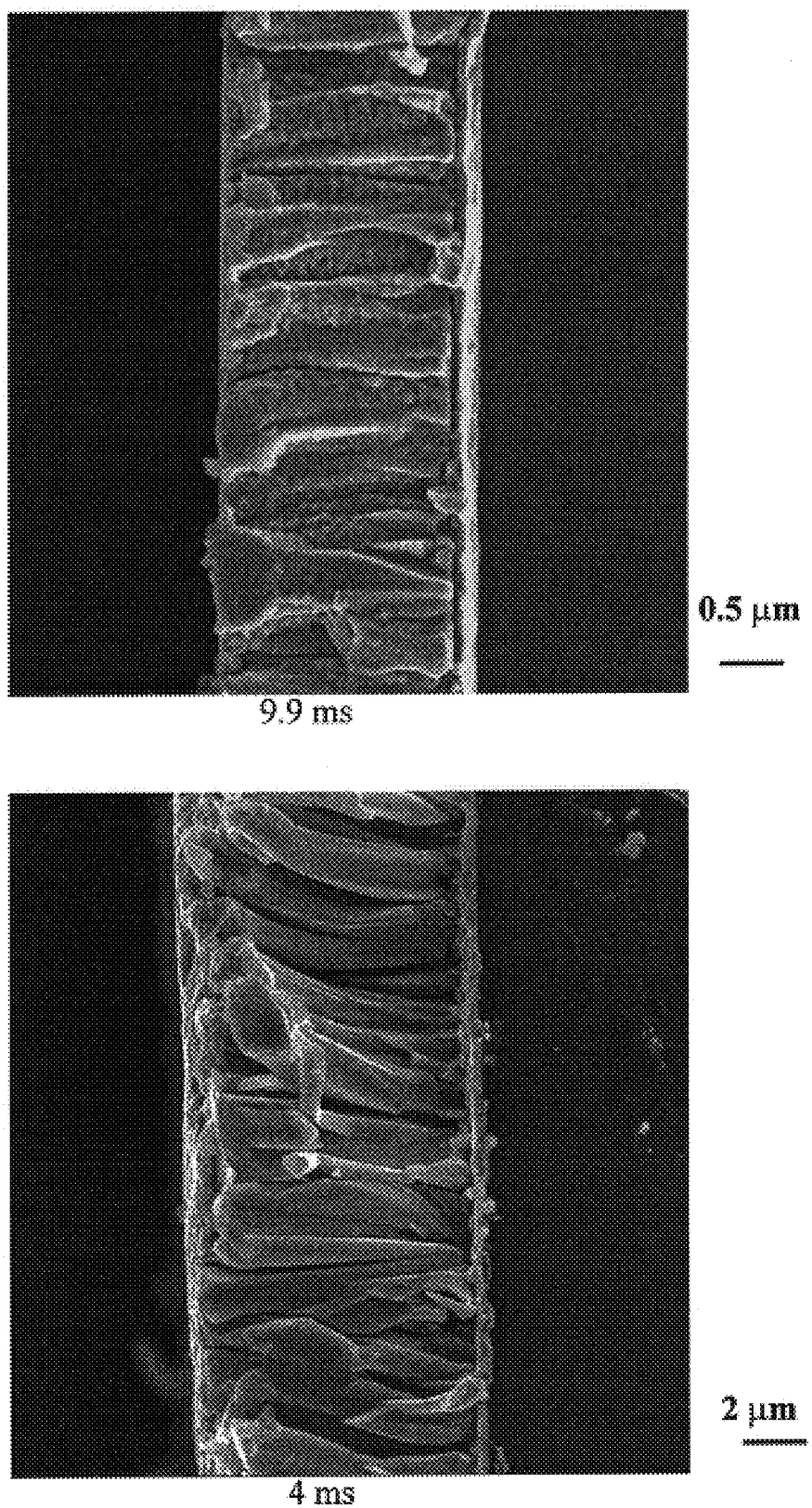
FIG. 12 is a copy of a SEM cross section image obtained at selected OFF times—corresponds to the ON times in FIG. 10.

Cleaved cross section images of samples obtained at OFF times of 9.9 ms and 4 ms are shown in FIG. 12. The thicknesses of the 2 deposits are 1.6 and 7.6 µm respectively. The average current density for the 4 ms OFF time sample is twice that of the 9.9 ms OFF time sample, however, the deposit thickness at 4 ms of OFF time is more than 4 times that of the 9.9 ms OFF time sample. Both samples exhibit a columnar structure, with the 9.9 ms OFF time sample being more dense.

Reproducibility Testing

Figure 13:
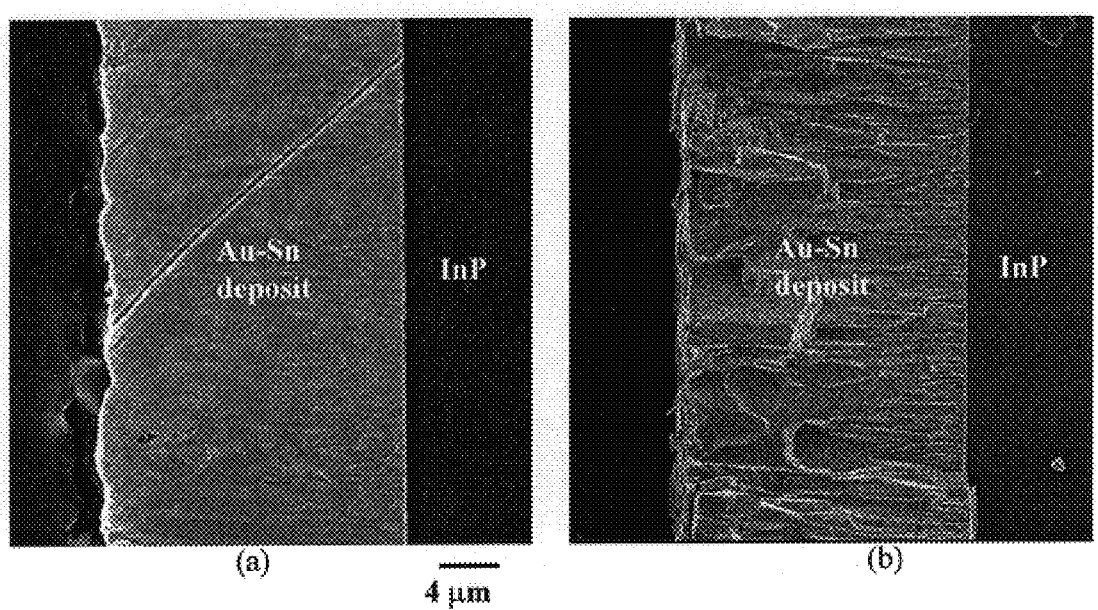
FIG. 13 show SEM images of a polished and cleaved cross section of a deposit obtained in a reproducibility test.

A single metallized InP wafer piece (∽1.46 cm$^2$ exposed area) was plated continuously from a 50 ml plating solution to a final thickness of ∽26 µm. Surface composition analysis of the resultant deposit at 5 different locations yielded an average composition of 10.8±0.6 at % Sn. The surface morphology was fairly coarse. SEM images of polished and cleaved cross sections are shown in FIG. 13. The deposits are columnar with a finer grain structure near the metallization layer. The fracture mode of the cleaved sections is primarily brittle in nature, but becomes more ductile near the deposit surface. This is an indication that the composition is more Sn-rich in the interior of the deposit and Sn-deficient near the surface.

Figure 14:
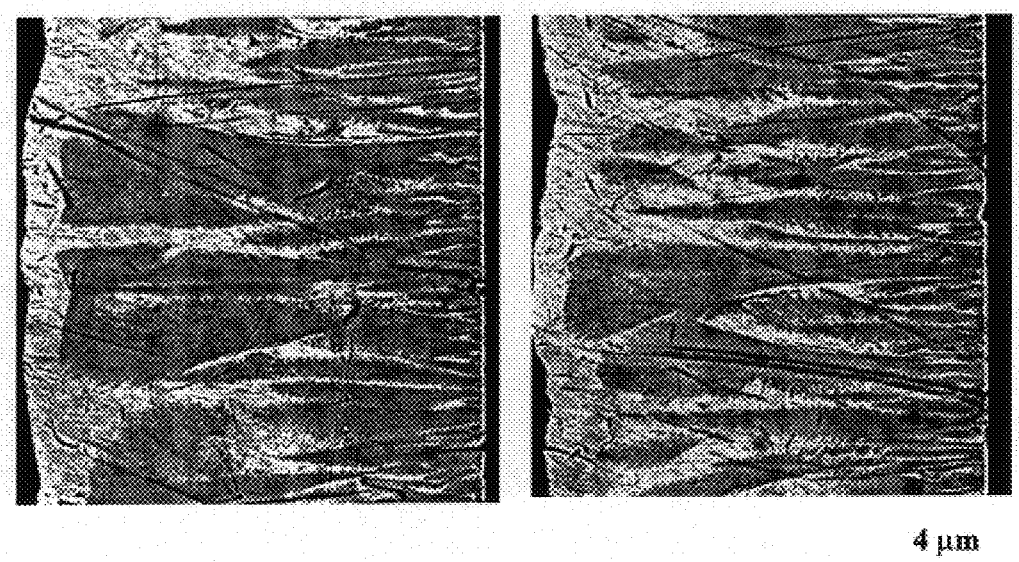
FIG. 14 is backscattered electron (BSE) images of several polished cross sections of a deposit obtained in a reproducibility test.
Figure 15:
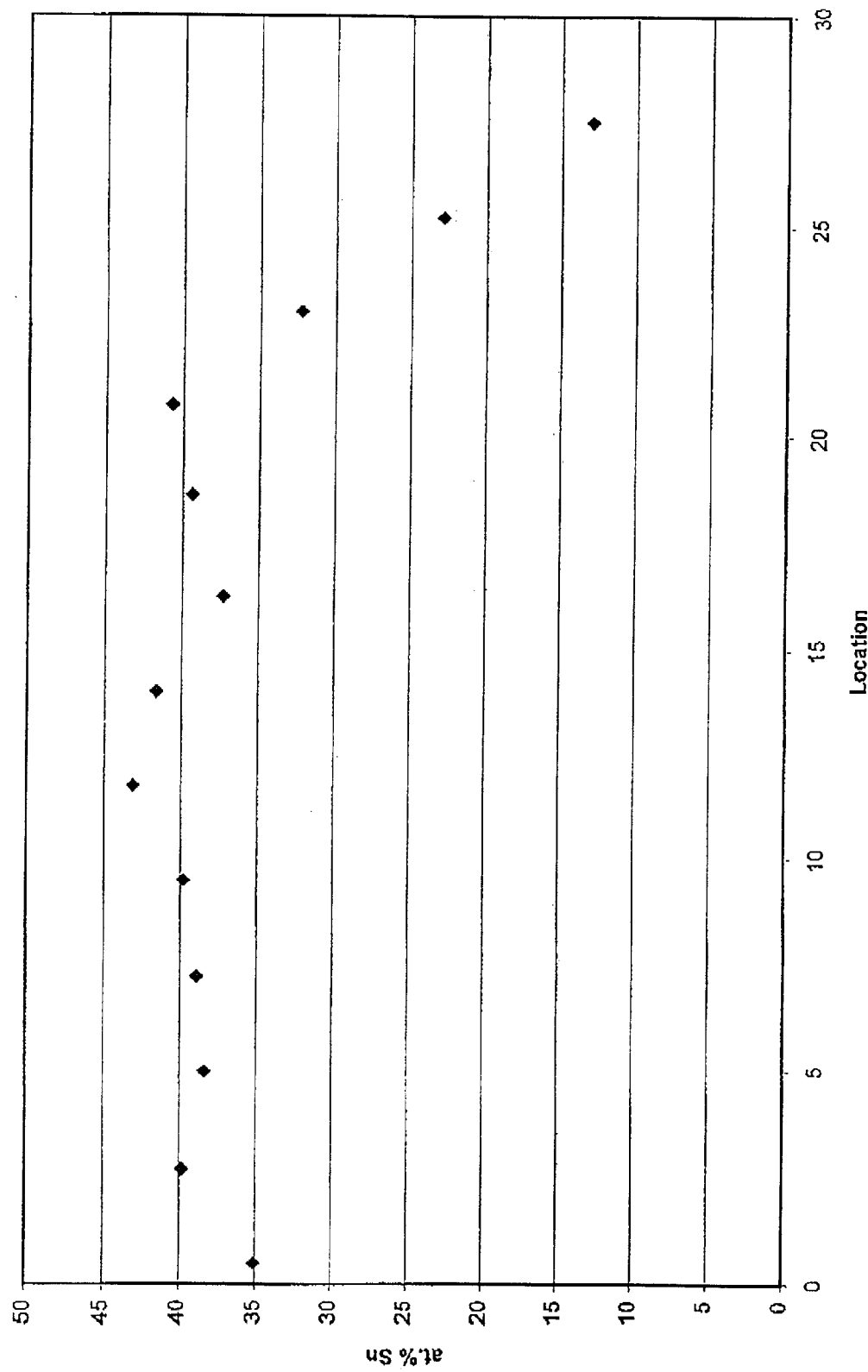
FIG. 15 is a plot showing the at % Sn at locations across the deposit measured from the semiconductor/solder interface outwards.

SEM backscattered electron (BSE) images of polished cross sections of 2 regions of the deposit are shown in FIG. 14. The image contrast (due to atomic number effects) is more pronounced for the BSE images relative to the secondary electron (SE) images (FIG. 13), with the columnar behaviour clearly evident. Sn-rich regions are darker, while the lighter contrast regions are Au-rich. The BSE images show 2 distinct layers. The inner layer consists of 2 phases and is ∽23 µm thick, while the outer layer (2–3 µm thick) appears to be a single phase and Au-rich. The au-rich outer layer corroborate the EDX analysis done on the surface of the deposit. Composition depth profiles (at 2.25 µm intervals) at 4 locations were done through the thickness of the deposit. Because of local variations in composition, due primarily to presence of 2 distinctly different phases the profiles were summed and plotted as a single profile (FIG. 15). The resultant composition profile correlates well with the cross section images, i.e., up to 22–23 µm of Au/Sn solder of uniform composition can be deposited from a single 50 ml solution.

Based on the above information, the number of InP wafers (2 inch diameter) that could be wafer, then a total of ∽19 wafers could be plated before replenishing the bath. process was scaled up to a 2 L plating solution and 3.5 µm of solder was deposited on each wafer, then a total of ∽19 wafers could be plated before replenishing the bath.

The percentage of Au in the bath consumed after plating ∽22 µm of solder (before the Sn content decreases) can can be estimated by assuming the density of the deposit is equal to the bulk density of an equilibrium alloy consisting of Au$_5$Sn and AuSn. The total volume V of the deposit is the product of the plated area (1.46 cm$^2$) and the deposit thickness (∽22 µm). Since the average composition of the deposit is Au-39 at % Sn (Au-28 wt % Sn), the volume percentage of Au$_5$Sn and AuSn in the deposits is ∽35% and 65% respectively. The deposit density $\rho_d$ can be estimated from a weighted average of the densities of Au$_5$Sn and AuSn, yielding a value of ∽13.6 g/cm$^3$. If $g_{Au}$ is the total weight of Au added to the bath prior to plating, then the percentage of Au consumed after plating 22 µm of solder is $$(V\rho_d \text{wt \% Au}_{deposit})/g_{Au} \approx 24 \text{ wt \%}$$

The percentage of Sn consumed can be calculated in a similar manner and amounts to ∽8.5 wt %. The Au content in the plating solution has changed significantly, while the Sn content has only changed a small amount.

Decreasing Sn content with increasing plating time has been addressed by Holbrom et al This explanation is reasonable for a large current density which is close to the limiting current [21], who attributes it to faster Sn consumption due to the formation of Sn-rich agglomerates. This explanation is reasonably for a large current density which is close to the limiting current limiting current density of ∽4 mA/cm$^2$. The change in deposit composition with plating time density. For this work, the current density is 1.6 mA/cm$^2$, which is significantly lower than the limiting current density of ∽4 mA/cm$^2$. The change in deposit composition with plating time may instead be due to composition changes in the solution additives.

A relatively stable, non-cyanide, weakly acidic solution has been utilized to co-electroplate Au—Sn solder on metallized semiconductor substrates. Depositions were done under both DC and PC conditions and the results are summarized in the following.

In the studied range of average current density, PC deposits have consistently higher Sn content than DC deposits. At low current densities (<2.4 mA/cm$^2$), the microstructures are similar, while at higher current densities, PC deposits are finer and smoother.

For PC plating, when the average current density and cycle period are held constant, the composition vs ON time plot shows a plateau. Deposits obtained at 2 ms of ON time, which is within the plateau region, have the finest and smoothest microstructure. When the peak current density and OFF time are held constant, a plateau is also observed in the deposit composition vs ON time curve. Grain structures are finer for shorter ON times.

When the peak current density and OFF time are held constant, a plateau is also observed in the deposits first increases with increasing OFF time and then reaches a plateau. Short OFF times (3–4 ms) give coarse grained microstructures, while longer OFF times (6–9.9 ms) give consistently uniform microstructures.

Reproducibility tests indicate that several 2 inch wafers (>10) could be electroplated with Au-Sn solder (Ú39 at % Sn) to a thickness of 3.5 $\mu$m.

Applicant has attained plate solder layers ranging in thickness from submicron (100–200 nm) to several microns with compositional uniformity (compositional variations across the entire deposit of less than 5%). Suitable deposits can be obtained for ON times ranging from 10–40% of the duty cycle; current densities ranging from 1.6–3.6 mA/cm$^2$.

Having described the invention, modifications will be evident to those skilled in the art without departing from the scope of the invention as defined in the appended claims.

We claim:

1. An electroplating solution comprising ammonium citrate, potassium gold chloride (KAuCl$_4$) soluble in said ammonium citrate, tin chloride (SnCl$_2$) soluble in said ammonium citrate, sodium sulfite as stabilizer and a tin stabilizer, said potassium gold chloride being present in the amount of between 5 and 20 g/L and said tin chloride being present in the amount of between 5 and 20 g/L.

2. An electroplating solution as defined in claim 1 wherein the ratio of gold to tin is in the range of 0.5 to 3.0 by weight.

3. An electroplating solution as defined in claim 1 wherein said gold and tin are present in a ratio to form deposits with a range of tin compositions from 25 to 50 at % Sn.

4. An electroplating solution as defined in claim 2 wherein said gold and tin are present in a ratio to form deposits with a range of tin compositions from 30 to 40 at % Sn.

5. An electroplating solution as defined in claim 1 wherein said tin stabilizer is L-ascorbic acid.

6. An electroplating solution as defined in claim 2 wherein said tin stabilizer is L-ascorbic acid.

7. An electroplating solution as defined in claim 3 wherein said tin stabilizer is L-ascorbic acid.

8. An electroplating solution as defined in claim 4 wherein said tin stabilizer is L-ascorbic acid.

* * * * *